(12) United States Patent
Yamada et al.

(10) Patent No.: US 6,414,325 B1
(45) Date of Patent: Jul. 2, 2002

(54) CHARGED PARTICLE BEAM EXPOSURE APPARATUS AND EXPOSURE METHOD CAPABLE OF HIGHLY ACCURATE EXPOSURE IN THE PRESENCE OF PARTIAL UNEVENNESS ON THE SURFACE OF EXPOSED SPECIMEN

(75) Inventors: Akio Yamada; Tatsuro Ohkawa, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/352,425

(22) Filed: Jul. 13, 1999

(30) Foreign Application Priority Data

Jul. 16, 1998 (JP) .......................... 10-201798
Jun. 8, 1999 (JP) .......................... 11-161106

(51) Int. Cl.[7] .......................... G01N 23/00; H01J 37/30
(52) U.S. Cl. .................. 250/491.1; 250/492.2
(58) Field of Search .......................... 250/491.1, 492.2

(56) References Cited

U.S. PATENT DOCUMENTS

| 4,468,565 A | * | 8/1984 | Blair et al. ............. 250/491.1 |
| 4,678,919 A | | 7/1987 | Sugishima et al. ...... 250/491.1 |
| 5,166,529 A | | 11/1992 | Ando et al. ............. 250/491.1 |
| 5,301,124 A | * | 4/1994 | Chen et al. ............. 250/491.1 |
| 5,757,015 A | | 5/1998 | Takemoto et al. ....... 250/491.1 |
| 5,793,474 A | * | 8/1998 | Nishi ........................ 355/72 |
| 6,104,493 A | * | 8/2000 | Fuse et al. .................. 356/379 |
| 6,107,637 A | * | 8/2000 | Watanabe et al. ........ 250/559.3 |

FOREIGN PATENT DOCUMENTS

JP 60-79722 5/1985

* cited by examiner

Primary Examiner—Bruce Anderson
(74) Attorney, Agent, or Firm—Christie, Parker & Hale, LLP

(57) ABSTRACT

A charged particle beam exposure apparatus capable of detecting a partial unevenness and adjusting the height of the surface of a specimen to be exposed is disclosed. This charged particle beam exposure apparatus comprises a charged particle beam source, a charged particle beam shaper, a deflector for changing the position where the charged particle beam is radiated on the specimen, a projector for projecting the charged particle beam on the specimen, and a control unit for controlling the deflector and the projector at the time of exposure. A pattern is plotted on the specimen by the charged particle beam being converged and deflected appropriately. The apparatus further comprises a stage for moving the specimen within the apparatus, and a height measuring unit for measuring the height distribution in a predetermined range of the specimen with at least a predetermined density while the specimen is loaded in the apparatus.

14 Claims, 9 Drawing Sheets

CHARGED PARTICLE BEAM EXPOSURE APPARATUS AND EXPOSURE METHOD CAPABLE OF HIGHLY ACCURATE EXPOSURE IN THE PRESENCE OF PARTIAL UNEVENNESS ON THE SURFACE OF EXPOSED SPECIMEN

BACKGROUND OF THE INVENTION

The present invention relates to an exposure technique using a charged particle beam such as an electron beam or, in particular, to an exposure apparatus and an exposure method useful for detecting partial unevenness or partial distortion on the surface of a specimen (specifically, a wafer) to be exposed.

With the increase in density of integrated circuits in recent years, a new exposure method using a charged particle beam such as an electron beam or an ion beam or an exposure method using X-rays has been studied and realized as a method to replace photolithography which has long been the mainstay for forming fine patterns. Among these new methods, the electron beam exposure for forming a pattern using an electron beam has a great feature in that the sectional area of the electron beam can be reduced to the order of several tens of nm and can form a pattern as fine as not more than 1 $\mu$m.

The electron beam exposure apparatus is for exposing a finer pattern than photolithography, and for an exposure to be effected with high accuracy, a beam having a predetermined sectional shape is required to be focused to assure accurate irradiation at the desired position on a wafer. A change of the surface position (i.e. the height) of the wafer causes an out-of-focus condition and the displacement of the exposure position. The out-of-focus condition and the displacement deteriorate the accuracy of the exposure pattern.

In photolithography, it is common practice to expose one chip (die) in one shot. The exposure is effected on the assumption that the wafer height is the same within the exposure range of one chip. In other words, a change in height, if any, within the exposure range of one chip cannot be adjusted. For this reason, the change in height within the exposure range of one chip has not been measured. In the electron beam exposure apparatus, in contrast, the range exposed in one shot is smallest for the single beam method, and increases for the variable rectangle method, the block exposure method and the BAA exposure method, in that order. Nevertheless, the maximum exposure range is limited to a square of several tens of $\mu$m. If the wafer height is measured and adjusted for each exposure range, the exposure of higher accuracy is made possible. For this adjustment to be carried out, it is necessary to accurately measure the wafer position, i.e. the height of the wafer surface where the beam is to be irradiated.

A well known conventional method of measuring the wafer surface height includes a method using an electron beam or a light beam. In the method using an electron beam, a reference pattern formed on the wafer for exposure alignment is scanned while changing the focal point of the electron beam and the beam reflected in the process is detected. It is determined that the beam is exactly focused at the time point when the reflected beam detection signal has undergone the sharpest change. This method poses the problem, however, that the measurement is possible only for a portion having a reference pattern and that a multiplicity of scanning operations are actually required by changing the focal point, thus requiring a long time for measurement.

Another category of methods known for measuring the wafer surface height uses an optical height measuring apparatus. This category includes a method for detecting the displacement of the focal point by use of astigmatism or a knife edge and detecting the height of the wafer surface from the position controlled by feedback in such a manner as to secure a focal point on the wafer surface, or a method in which a light beam is radiated on the wafer surface and the displacement of the reflected light beam is detected thereby to detect the height or height change of the wafer surface. In any case, the height is measurable only at a point on the wafer. For measuring the height distribution over the entire wafer surface, the wafer is moved with a stage, the height is measured at a plurality of points on the wafer, and the measurement points are interpolated by the spline function or the Wentzel function thereby to calculate a curved surface indicating the height distribution over the entire surface. The height may be measured continuously while moving the wafer, in which case the height is measured along the locus of movement so that the curved surface indicating the height distribution over the entire wafer surface is also calculated by interpolation. According to this curved surface, the focus and the deflection efficiency of the electron beam for exposure are set to adjust the height of the wafer surface.

The conventional methods of height measurement described above pose no problem in the case where an unevenness or distortion occurs over a comparatively wide area on the wafer surface, i.e. as far as the unevenness is such that it can be approximated by a smooth curved surface. In such cases, the wafer surface height can be adjusted with high accuracy.

In the case where partial unevenness or partial distortion is present in a comparatively small range of the wafer surface, however, the problem is that the points where the partial unevenness is present cannot always be identified.

The partial unevenness is often caused by foreign matter such as dust or wafer parts caught between the electrostatic chuck (wafer chuck) and the wafer when the latter is fixed on the stage. Such foreign matter is either stuck on the stage and changes the partial height at the same position repeatedly or is delivered with the wafer after the exposure process and is thus removed before the next wafer is fixed on the stage. In any way, the problem is encountered that the presence of partial unevenness on the wafer surface cannot be ascertained. In the case where partial unevenness or the like is present on a given wafer, it is of prime importance that the fact can be ascertained and that some preventive measure can be taken against the particular wafer.

Other means conceivable for detecting partial unevenness or the like of the wafer surface is to increase the number of measurement points by finely moving the stage carrying the wafer in the conventional height measurement process. This method, however, cannot accurately identify whether the detected partial unevenness is caused by the wafer itself or due to the movement of the stage and the resulting height change. The problem, therefore, is that the determination of the detection result remains ambiguous. Also, the great number of measurement points consumes a considerable length of time and reduces the throughput of the apparatus as a whole.

SUMMARY OF THE INVENTION

The present invention has been created in view of the problems of the prior art described above, and the object thereof is to provide a charged particle beam exposure apparatus and an exposure method in which a partial unevenness developed on the surface of a specimen to be exposed can be positively detected and thus the height of the specimen surface to be exposed can be accurately adjusted, thereby contributing to a highly accurate exposure and an improved yield.

A charged particle beam exposure apparatus and method according to the present invention use a height measuring unit for measuring the height distribution in a predetermined range on a specimen to be exposed at not less than a predetermined density with the specimen loaded in the apparatus.

Specifically, according to one aspect of the present invention, there is provided a charged particle beam exposure apparatus comprising a charged particle beam source for generating a charged particle beam, a shaper for shaping the charged particle beam, a deflector for changing the position at which the charged particle beam is radiated on the specimen to be exposed, a projector for projecting the charged particle beam on the specimen to be exposed, a control unit for controlling the deflector and the projector at the time of exposure, means for plotting a pattern on the specimen to be exposed by the charged particle beam projected and deflected appropriately, a stage for moving the specimen to be exposed within the apparatus, and a height measuring unit for measuring the height distribution in a predetermined range of the specimen to be exposed at not less than a predetermined density while the specimen is loaded in the apparatus.

The apparatus preferably further comprises a detected height processing unit for changing the measuring points of the specimen to be exposed for the height measuring unit by moving the specimen with a stage, combining the measurements at the various points and calculating the height distribution over the entire surface of the specimen to be exposed.

According to another aspect of the invention, there is provided a charged particle beam exposure method for plotting a pattern on a specimen to be exposed by a charged particle beam converged and deflected appropriately on the specimen, comprising the steps of, before plotting the pattern by the charged particle beam, loading the specimen on a stage of an exposure apparatus, measuring the height distribution in a predetermined range of the specimen at not less than a predetermined density, calculating the height distribution over the entire surface of the specimen by changing the measuring points on the specimen moved with the stage and combining the measurements at the various points, determining the allowability of the partial height change of the specimen based on the measurements, and exposing the specimen in the case where the determination of the allowability is satisfactory.

In the configuration for the charged particle beam exposure apparatus and method according to this invention, the height distribution in a predetermined range of the specimen surface is measured by a height measuring unit with the specimen loaded in the apparatus when a pattern is not plotted (the exposure process is not executed) by the charged particle beam. A partial unevenness on the specimen to be exposed which has thus far been difficult to identify with the conventional height measuring method can be positively detected. As a result, the height measurement and the height adjustment (by focusing or setting the deflection efficiency of the charged particle beam at the time of exposure) based on the height measurement of the specimen to be exposed can be carried out with high accuracy, thereby making it possible to attain a highly accurate exposure and improve the yield.

The apparatus preferably further comprises an alarm unit for issuing an alarm notifying a height change, if any is detected, exceeding a predetermined allowance within a predetermined range of the exposure area on the specimen to be exposed and a storage unit for storing information on the position of the stage corresponding to the position on the specimen where the height has changed. An alarm is issued, for example, in accordance with the result of determination as to whether an estimation value K defined as $K=\Delta H/\Delta L$ has exceeded a predetermined value, where $\Delta L$ is the distance between two points in the exposure area on the specimen to be exposed and $\Delta H$ is the difference of height between the two points. Further, the apparatus preferably comprises a determination unit for determining whether the height change exceeding a predetermined allowance is caused by the specimen itself or the stage, from the information on the stage position where the alarm is issued on a plurality of specimens.

The height measuring unit includes, for example, a light beam emitter for emitting a plurality of light beams parallel to each other in a two-dimensional array and a two-dimensional light detector for detecting a plurality of light beams reflected from the surface of the specimens to be exposed. The light beam emitter is configured either in such a manner as to include a plurality of light beam sources in a two-dimensional array or in such a manner as to include a laser beam source, a lens for converting the laser beam emitted from the laser beam source into a parallel beam and an aperture array having a plurality of apertures in a two-dimensional array for splitting the parallel beam into a plurality of beams corresponding to the apertures.

The height measuring unit is an interference unit for measuring the height distribution from the interference fringe generated by interference between the light beam reflected from a reference plane and the light beam reflected from the surface of the specimen to be exposed. This interference unit may be a Twyman-Green interferometer including a laser beam source, a lens for converting the laser beam emitted from the laser beam source into a parallel beam, a reference reflection surface, a beam splitter for splitting the parallel beam into a beam incident to the surface of the specimen to be exposed and a beam incident to the reference reflection surface and combining the beam reflected from the specimen surface and the beam reflected from the reference reflection surface, and a two-dimensional light detector for detecting the interference pattern obtained in the form of a combined light beam.

The above and other objects, features and advantages will be described in detail below with reference to embodiments.

BRIEF DESCRIPTION OF THE DRAWINGS

The present invention will be more clearly understood from the description as set forth below, with reference to the following drawings, wherein.

DESCRIPTION OF THE PREFERRED EMBODIMENTS

Prior to a description of the prior art, an electron beam exposure apparatus according to this invention and the problem points of the conventional apparatus will be briefly explained.

In the prior art, the exposure process using an electron beam has been carried out by a single-beam exposure method employing what is called "the single-stroke" drawing method. The finer the pattern, therefore, the smaller the beam required for exposure. The result is an extremely long time required for exposure. In order to obviate this inconvenience, a variable rectangle exposure method, a blanking aperture array exposure method, a block exposure method, etc. have been devised and find practical applications. The present invention, which is applicable to any of the exposure methods described above, will be explained below taking the block exposure method as an example.

The block exposure method uses a block mask formed with apertures corresponding to several basic patterns constituting units of repetitive patterns. The unit patterns are generated by transmitting a beam through the desired apertures of the block mask and irradiating a specimen to be exposed. Then, the unit patterns are connected to expose a repetitive pattern. The block exposure method is very effective for exposing a fine pattern for a 1 Gb DRAM or a 4 Gb DRAM in which a basic pattern is repetitively formed over substantially the entire area of exposure.

Figure 1:
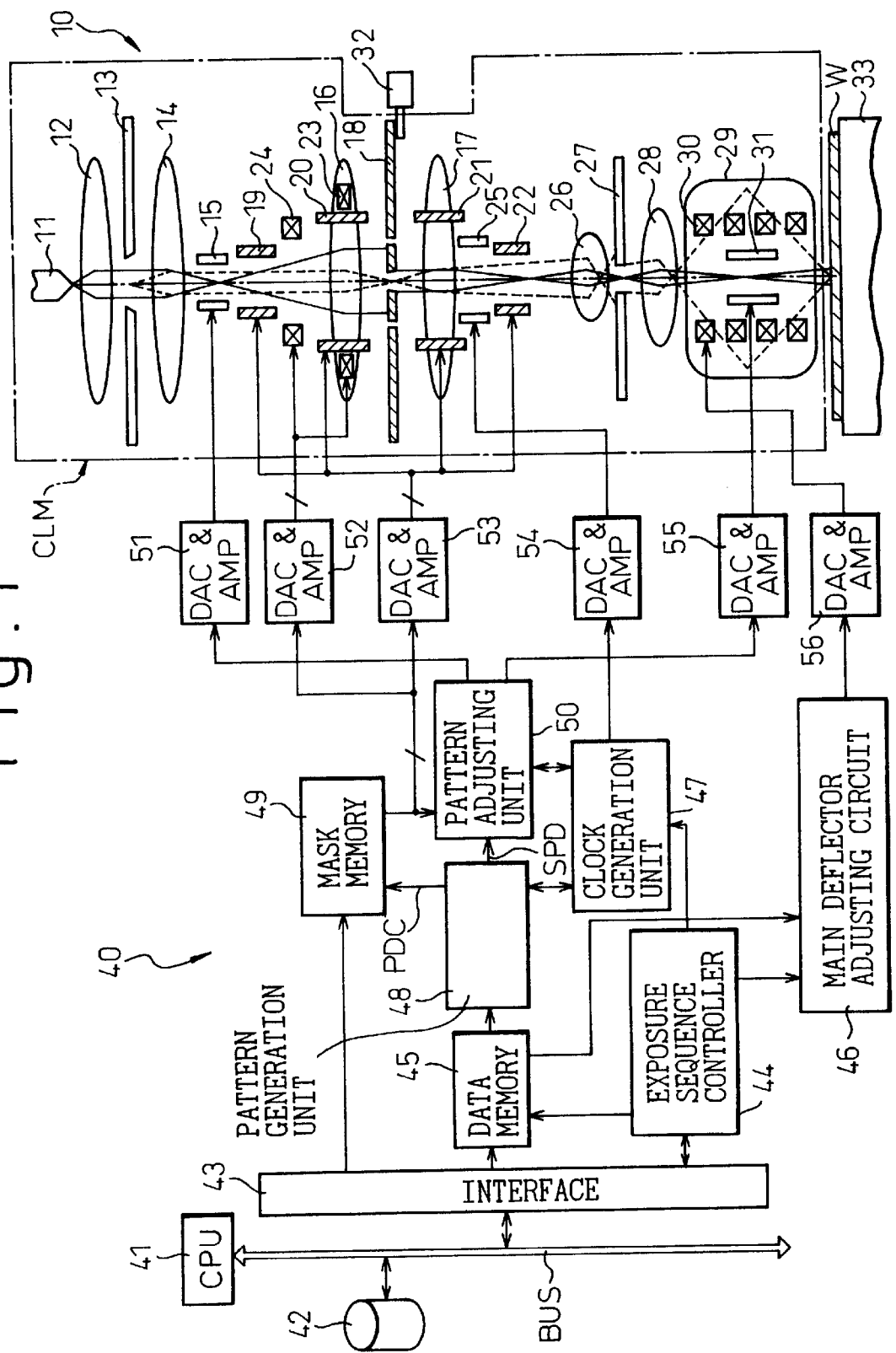
FIG. 1 is a diagram schematically showing a part of a typical configuration example of an electron beam exposure apparatus using the block exposure method.

FIG. 1 schematically shows a typical configuration example of an electron beam exposure apparatus using the block exposure method.

As shown, the electron beam exposure apparatus is configured of an exposure unit 10 and a control unit 40. In the exposure unit 10, the portion CLM defined by onedot chain is called the "column". In the column CLM, reference numeral 11 designates an electron gun for emitting an electron beam, numeral 12 a lens for converting the emitted electron beam into a parallel beam, numeral 13 a mask having apertures for shaping the section of the electron beam into a rectangle, numeral 14 a lens for converging the electron beams thus shaped, numeral 15 a deflector for deflecting the position at which the shaped electron beam is radiated on the block mask (the portion designated by 18 described later), numerals 16, 17 lenses arranged in an opposed relation to each other along the direction of the electron beam flow, numeral 18 a block mask arranged horizontally movably between the lenses 16 and 17 and formed with apertures (transmission patterns) for shaping the section of the electron beam as desired, numerals 19 to 22 mask deflectors for selecting the desired transmission pattern by deflecting the electron beam on the block mask 18 and returning the electron beam that has passed through the desired transmission pattern onto the original optical axis, numerals 23, 24 a dynamic focus coil and a dynamic stigue coil for adjusting the deflection of the electron beam, respectively, numeral 25 a blanking deflector for shutting off or transmitting the electron beam, numeral 26 a lens for reducing the section of the electron beam, numeral 27 a mask having an aperture for shaping the section of the electron beam into a circle, numerals 28, 29 projection lenses for radiating the shaped electron beam on the specimen to be exposed (the wafer W described later), and numerals 30, 31 a main deflector and a subdeflector, respectively, for setting the beam in position on the wafer W.

Numeral 32 designates a mask stage for holding and moving the block mask 18 in horizontal direction, and numeral 33 designates a wafer stage movable in horizontal direction carrying the wafer W. This wafer stage 33, though not specifically shown, is arranged in a chamber coupled in vacuum state with the column CLM, and is connected to means (laser interferometer or the like) for detecting the coordinate position of the stage in horizontal direction and a stage moving mechanism for moving the stage based on the result of detection. In the description that follows, the wafer stage 33 will be simply called the stage.

In the control unit 40, on the other hand, numeral 41 designates a central processing unit (CPU) for controlling the whole electron beam exposure apparatus, numeral 42 a storage medium connected to the CPU 41 through a system bus BUS for storing design data for an integrated circuit unit or the like, numeral 43 an interface connected to the CPU 41 through the system bus BUS, numeral 44 an exposure sequence controller for controlling the sequence of the exposure process in general based on the exposure start/end information transferred from the interface 43, and numeral 45 a data memory for storing data on the plotting pattern and the block mask 18 transferred from the interface 43 with the data output controlled by the exposure sequence controller 44. Numeral 46 designates a main deflector adjusting circuit for performing such processes as calculating the deflection amount adjustment value for the main deflector 30 based on the main deflector deflection data from the data memory 45 under the control of the exposure sequence controller 44. Numeral 47 designates a clock generator for generating a calculation processing clock and a blanking clock for enabling the whole exposure apparatus to operate based on the exposure time data, the exposure time adjusting data and the settling time data for each shot being sent from the pattern generator and the pattern adjusting unit described later under the control of the exposure sequence controller 44. Numeral 48 designates a pattern generator for designating one of the patterns transmitted through the block mask 18 based on the data stored in the data memory 45 in response to the calculation processing clock from the clock generator 47, generating a master radiation position data (i.e. the pattern data code PDC indicating a particular transmission pattern used for exposing the desired plotting pattern) indicating the position of the designated pattern on the block mask 18, and generating a wafer exposure position data (i.e. the shot pattern data SPD corresponding to one beam radiation) indicating the position on the wafer W where the particular plotting pattern is to be exposed. Numeral 49 designates a mask memory for storing the relation (through the interface 43), measured in advance, between the position of each pattern (the pattern data code PDC) on the block mask 18 and a corresponding deflection data. Numeral 50 designates a pattern adjusting unit for performing such processes as calculating the adjustment value corresponding to the difference between the shape of the plotted pattern and the shape of the designated pattern based on the deflection data from the mask memory 49 and the shot pattern data SPD from the pattern generator 48 in response to the calculation processing clock from the clock generator 47. Numeral 51 designates a DAC & AMP (hereinafter referred to as "the amplifier unit" for convenience' sake) for converting the adjustment value from the pattern adjusting unit 50 into an analog value, amplifying and outputting it to the deflector 15 appropriately as the adjusted deflection data. Numerals 52, 53 designate amplifier units for converting the deflection data from the mask memory 49 into analog data, appropriately amplifying and outputting them to the dynamic focus coil 23 and the dynamic stigue coil 24 and the mask deflectors 19 to 22, respectively. Numeral 54 designates an amplifier unit for converting the blanking clock from the clock generator 47 into analog data, appropriately amplifying and outputting them to the blanking deflector 25 as a blanking signal. Numerals 55, 56 designate amplifier units for converting the adjustment value from the pattern adjusting unit 50 and the main deflector adjusting circuit 46 into analog values, appropriately amplifying and outputting them to the subdeflector 31 and the main deflector 30 as the adjusted deflection data.

In the configuration described above, the exposure process is performed in the following manner.

First, the data to be exposed are read from the storage medium 42 by the CPU 41 and stored in the data memory 45. Once the exposure is started with a start signal applied to the exposure sequence controller 44 from the CPU 41, the main deflector deflection data stored in the data memory 45 are sent to the main deflector adjusting circuit 46 where the adjustment value is calculated and applied, through the amplifier unit 56 as adjusted deflection data, to the main deflector 30. Then, after the output value is stabilized, the exposure sequence controller 44 controls the clock generator 47 to generate the calculation processing clock and the blanking clock. In response to this calculation processing clock, the pattern generator 48 reads the block data and the pattern data stored in the data memory 45, and generates a pattern data code PDC and a shot pattern data SPD, respectively, based on the respective data. Then, the deflection data for the pattern data code PDC are read from the mask memory 49 and applied to the pattern adjusting unit 50. The pattern adjusting unit 50, in response to the calculation processing clock, performs the adjustment value calculation process based on the deflection data and the shot pattern data SPD from the pattern generator 48. The data output from the pattern adjusting unit 50, the data read from the master memory 49 and the blanking clock generated from the clock generator 47 are input to corresponding amplifier units 51 to 55, respectively and, after being converted into analog data and amplified appropriately, are applied to the deflectors or the coils.

The electron beam that has been emitted from the electron gun 11, on the other hand, is converted into a parallel beam by the lens 12, and after passing through the rectangular aperture of the mask 13, is converged by the lenses 14, 16 and radiated on the block mask 18. The electron beam thus radiated is appropriately deflected on the block mask 18. Specifically, the deflection in a comparatively large range (about 5 mm) on the block mask 18 is carried out by the mask deflectors 19, 20. After the desired transmission pattern on the mask 18 is selected by the deflectors 19, 20, the deflection in a comparatively small range (about 500 $\mu$m) is carried out by the deflector 15. Then, the electron beam that has passed through the desired transmission pattern on the block mask 18 is returned onto the original optical axis by the mask deflectors 21, 22, and after being converged by the lens 17, is deflection-adjusted by a beam adjusting coil (the dynamic focus coil 23 and the dynamic stigue coil 24). Further, after passing between the blanking deflectors 25, the electron beam has the section thereof reduced by the lens 26, is passed through the circular aperture of the mask 27, and is projected on the wafer W through the projection lenses 28, 29 (i.e. exposed). The electron beam radiated on the wafer W is deflected in a large deflection area of about 2 mm by the main deflector 30 and further deflected in a small deflection area of about 100 $\mu$m by the subdeflector 31. In the process, the electron beam is turned on/off by the blanking deflector 25 thereby to plot a pattern on the wafer W.

An electron beam exposure apparatus of block exposure type was explained above. The electron beam exposure apparatuses using other exposure methods (such as the variable rectangle exposure method or the BAA exposure method) have also the same basic configuration and have the same steps of operation as the block exposure method.

Figure 2:
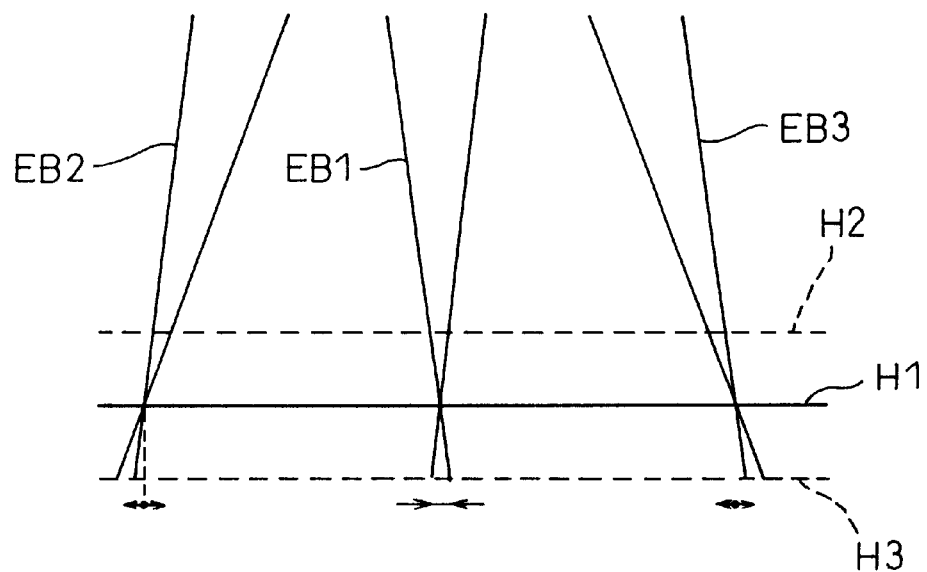
FIG. 2 is a diagram for explaining the effect of a change in the height of the exposure surface of an electron beam exposure apparatus.

FIG. 2 is a diagram for explaining the problem posed by the change in the wafer height. As shown in FIG. 2, the electron beams EB1 to EB3 focused on the wafer surface indicated by H1 develop an out-of-focus condition when the wafer surface changes to a point indicated by H2 or H3. Also, in the case where the wafer surface changes from H1 to H2 or H3, the electron beams EB2 and EB3 radiated at an angle of incidence to the wafer surface develops a displacement of the exposure position. This out-of-focus condition and the displacement deteriorate the accuracy of the exposure pattern.

In the photolithography technique, it is common practice to expose each chip (die) in one shot, and the exposure is carried out on the assumption that the wafer has the same height within the exposure range of one chip. In other words, a wafer height change, if any, within the exposure range of one chip cannot be adjusted. For this reason, the wafer height change within the exposure range of one chip is not measured. In the electron beam exposure apparatus, in contrast, the range exposed in one shot is smallest for the single beam method, and increases for the variable rectangle method, the block exposure method and the BAA exposure method in that order. At most, however, the exposure range, however, is a square of several tens of $\mu$m. As a result, the exposure of a higher accuracy is made possible by measuring and adjusting the wafer height for each exposure range. The out-of-focus condition is adjusted, for example, by the dynamic focus coil 23 and the dynamic stigue coil 24 shown in FIG. 1, while the out-of-position condition is adjusted by changing the deflection efficiency of the subdeflector 31, for example. These adjustment require accurate measurement of the position of the wafer to be irradiated with the beam, i.e. the height of the wafer surface.

Figure 3:
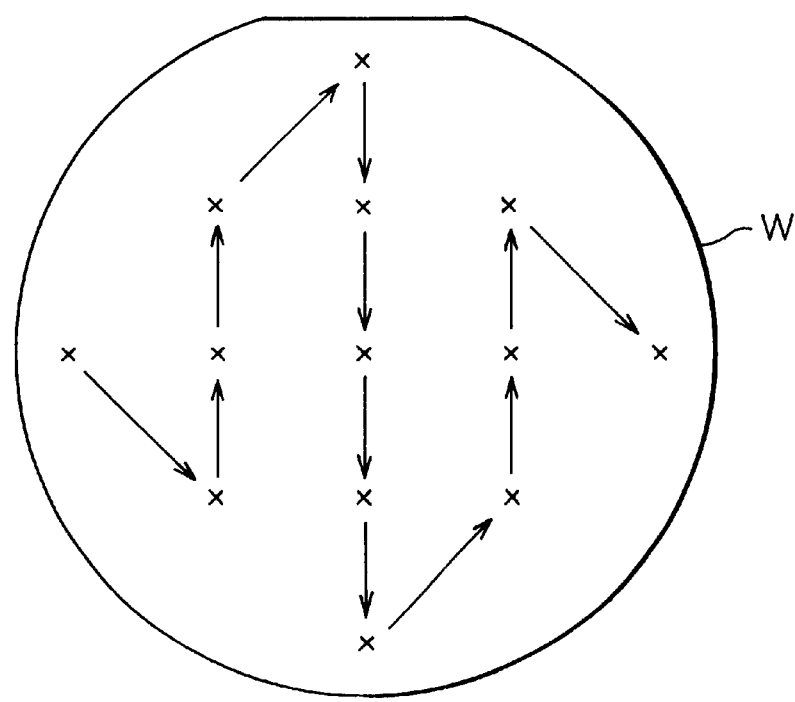
FIG. 3 is a diagram showing an example of measuring points for optically measuring the height of the exposure surface of a conventional electron beam exposure apparatus.

As described above, a method using an electron beam or a light beam is known as a method of measuring the height of the wafer surface. In any of the methods, however, the height at only one point is measured, and for measuring the height over the entire surface of the wafer, the stage is required to be moved, thereby posing the problem of an error with the movement of the stage. In the case where the height distribution over the entire wafer surface is measured with a height measuring unit using a light beam, for example, as shown in FIG. 3, the wafer is moved by the stage and the height at a plurality of points on the wafer is measured. The respective points are interpolated by the spline function or the Wentzel function thereby to calculate a curved surface indicating the height distribution over the entire surface. The height is measured continuously while moving the wafer, in which case the height is measured along the locus of movement and a curved surface is calculated indicating the height distribution over the entire wafer surface by interpolation or the like. According to the resulting curved surface, the electron beam is focused or the deflection efficiency is set at the time of exposure for adjusting the wafer surface height.

Figure 4:
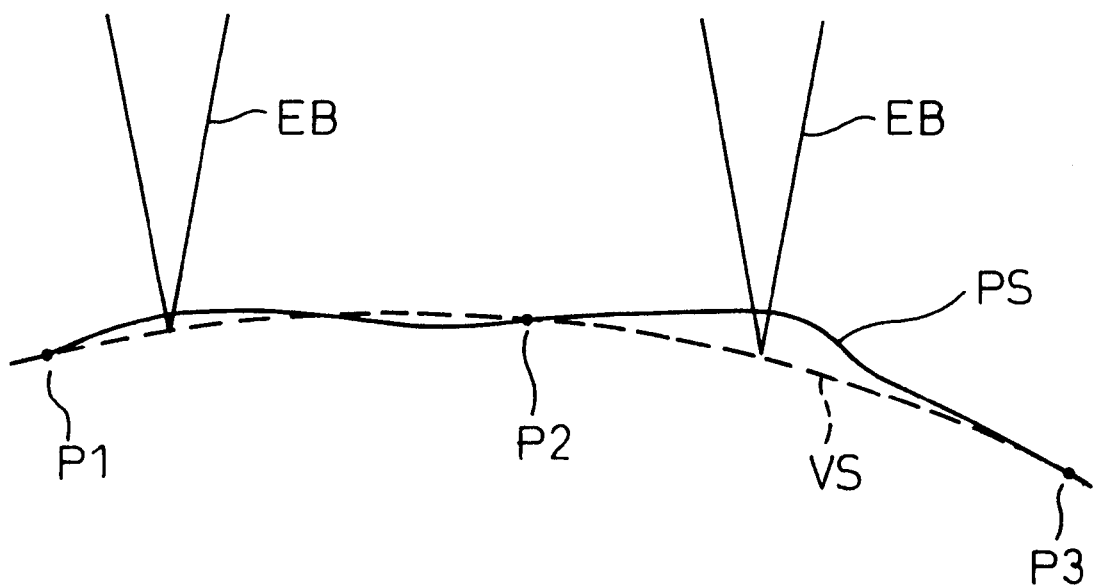
FIG. 4 is a diagram for explaining the problems posed in the case where a partial unevenness change occurs in the conventional method for calculating the height distribution by interpolation.

In the conventional method of height measurement described above, an unevenness or distortion may occur over a comparatively wide range of the wafer surface, i.e. an unevenness or the like that can be approximated by a smooth curved surface may occur. In this case, no special problem is posed and the wafer height surface can be adjusted with considerable accuracy. In the case where a partial unevenness or partial distortion has occurred within a comparatively small range of the wafer surface, however, the points where the partial unevenness or the like has occurred cannot always be identified. FIG. 4 is a diagram for explaining this problem. The height is measured at three points indicated by P1 to P3, and a curved surface VS indicating the height distribution as shown by dashed line is produced using the interpolation method approximating with the spline function or the Wentzel function, so that the adjustment is effected along this curved surface VS. In the case where a partial unevenness or the like which cannot be approximated by a smooth curved surface has occurred on the wafer surface, however, the actual surface is the one indicated by PS and the difference with the curved surface VS cannot be adjusted completely. As described above, this partial unevenness or the like is often caused by foreign matter like dust or wafer pieces being caught between the electrostatic chuck (wafer chuck) and the particular wafer.

In view of this, a conventional method conceived for solving this problem is by increasing the number of measuring points by finely moving the stage carrying the wafer. In this method, however, it is difficult to distinguish accurately whether the partial unevenness detected are caused by the wafer itself or by the height change due to the movement of the stage. The problem, therefore, is that the determination of the detection result remains ambiguous. Also, the multiplicity of measuring points consumes a considerable length of time for measurement, thereby leading to the problem of a reduced throughput of the apparatus as a whole.

Figure 5A:
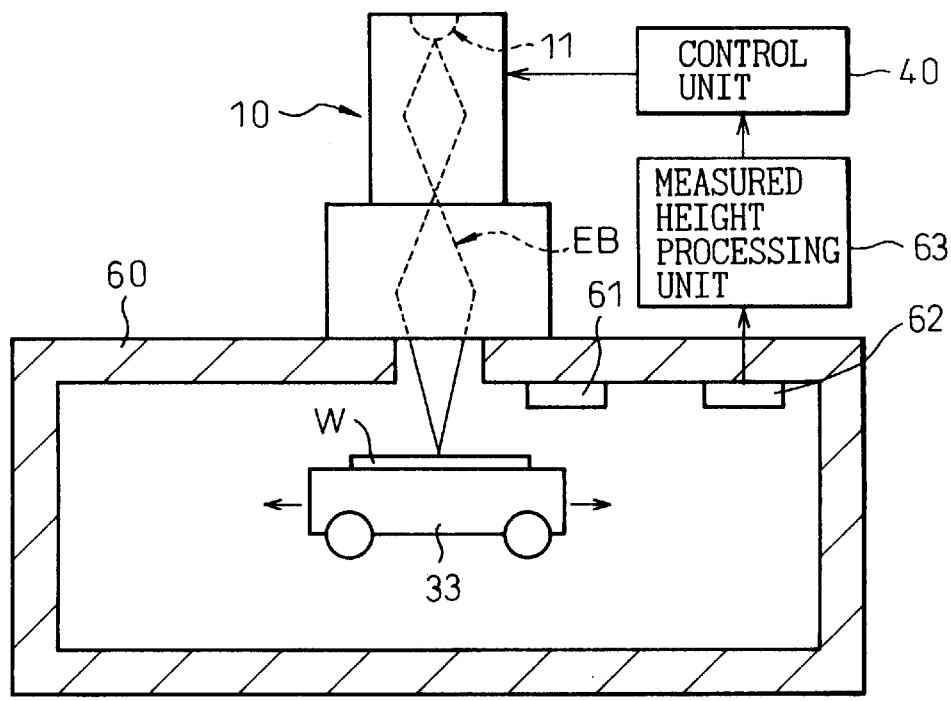
FIGS. 5a and 5b are diagrams schematically showing a part of a configuration of an electron beam exposure apparatus according to a first embodiment of the present invention.
Figure 5B:
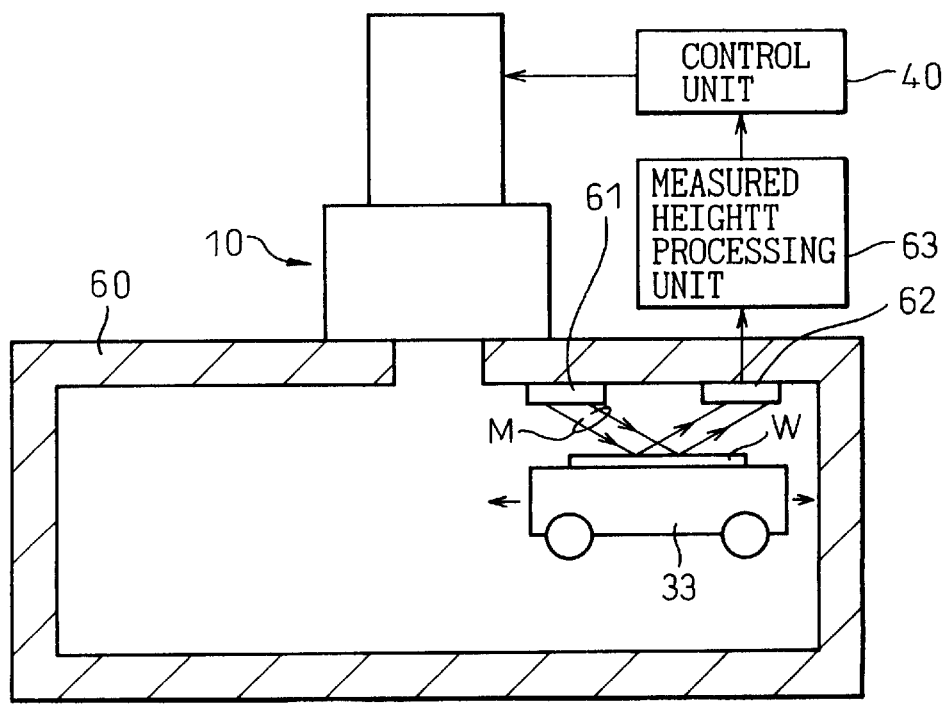

FIGS. 5a and 5b are diagrams schematically showing a part of the configuration of an electron beam exposure apparatus according to a first embodiment of the invention. As in FIG. 1, reference numeral 10 designates an exposure unit, numeral 11 an electron gun for emitting an electron beam EB, character W a wafer, numeral 33 a stage movable in horizontal direction carrying a wafer W, and numeral 40 a control unit. Further, numeral 60 designates a chamber for housing the stage 33 carrying the wafer W while maintaining a vacuum condition with the column CLM. The column CLM and the control unit 40 basically have the same configuration as the one explained above with reference to FIG. 1.

The apparatus according to this embodiment further comprises a height measuring unit including a light beam emitter 61, a two-dimensional light detector 62, and a measured height processing unit 63 for processing the output signal of the two-dimensional light detector 62 and calculating the height distribution. The light beam emitter 61 and the two-dimensional light detector 62 are arranged on the upper inner wall of the chamber 60 as shown. The measured height processing unit 63 is realized by software, for example, in the CPU 41 of FIG. 1. The light beam emitter 61 and the two-dimensional light detector 62, as described later, are used for measuring the height change of the wafer surface prior to the exposure of the wafer W. For this purpose, the radiation light M emitted from the light beam emitter 61 is used.

When measuring the height change of the wafer surface, therefore, as shown in FIG. 5b, the wafer W is moved appropriately to the position irradiated with the light M radiated from the light beam emitter 61, while being loaded on the stage 33. In the exposure process of the wafer W, on the other hand, as shown in FIG. 5a, the stage 33 carrying the wafer W is appropriately moved from the column CLM to the position irradiated with the electron beam EB.

A specific configuration example of the light beam emitter 61 and the two-dimensional light detector 62 according to the first embodiment will be explained with reference to FIGS. 6a to 6d and FIGS. 7a and 7b.

Figure 6A:
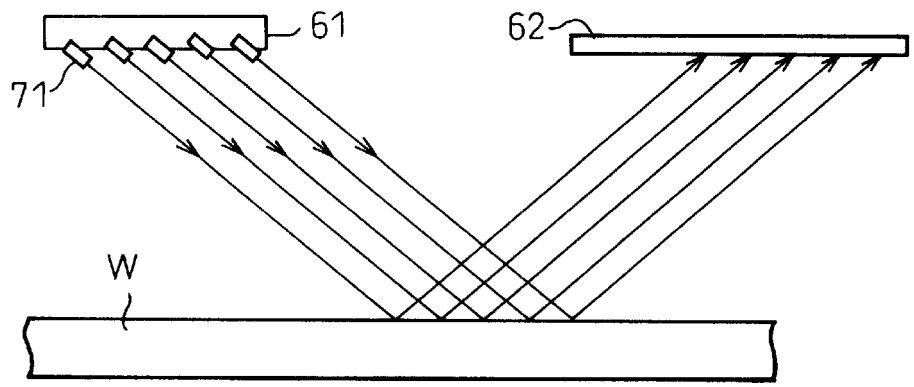
FIGS. 6a to 6d are diagrams for explaining a configuration of the height measuring unit and the principle of detection by the apparatus according to the first embodiment.
Figure 6B:
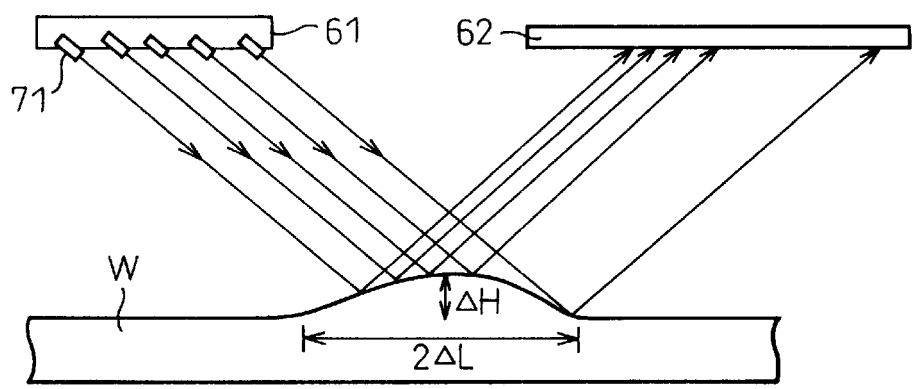
Figure 7A:
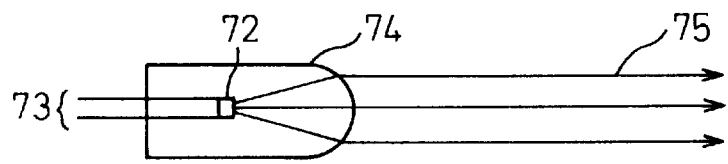
FIGS. 7a and 7b are diagrams showing an example configuration of a light beam emitter of the apparatus according to the first embodiment.
Figure 7B:
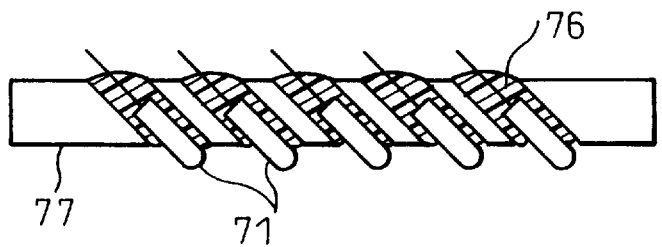

First, as shown in FIGS. 6a and 6b, the light beam emitter 61 has a plurality of light beam sources 71 in two-dimensional array. Each light beam source 71, as shown in FIG. 7a, is so configured that a light source 72 constituting a substantially spot light source such as a LED or a semiconductor laser is molded with a lens body 74 of transparent plastics or the like. The lens body 74 has a spherical or aspheric lens surface on one side thereof, so that the light from the light source 72 is emitted as an almost parallel beam. Reference numeral 73 designates a terminal of the light source 72. As shown in FIG. 7b, a multiplicity of light beam sources 71 (5×5 in this case) are fixed with a jig or the like and are arranged in such a manner that the rear side of each light beam source 71 is located in a hole of the base plate 77. Then, each light beam source 71 is turned on to emit a light beam. The light beams from the light beam sources 71 are adjusted by the adjusting mechanism of the jig so that they are emitted in parallel in a predetermined direction. With the adjustment complete, a plastic or an adhesive 76 is injected into the holes of the base plate 77 thereby to fix each light beam source 71 on the base plate 77. As a result, a light beam emitter 61 for emitting a plurality of mutually parallel light beams is obtained.

The two-dimensional light detector 62 is an image pickup device such as a CCD. In the configuration shown in FIGS. 6a and 6b, a plurality of light beams emitted from the light beam emitter 61 toward the wafer W are reflected from the surface of the wafer W, and the direction of the reflection (i.e. the beam position) is detected by the two-dimensional light detector 62.

Figure 6C:
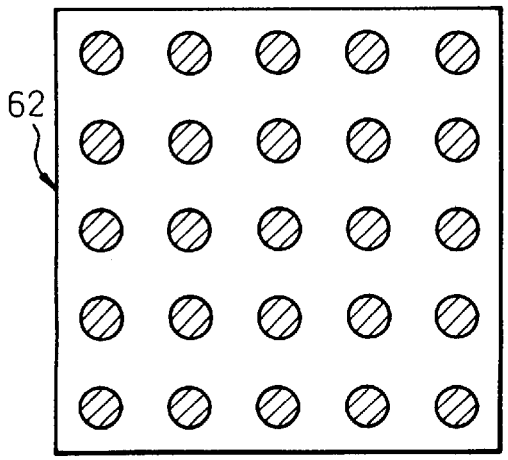

In the process, as shown in FIG. 6a, assume that the surface of the wafer W is substantially flat (i.e. no partial unevenness or the like has developed). The pattern (detection pattern) indicating the position of each beam detected by the two-dimensional light detector 62 is a regular one corresponding to the arrangement of the light beam sources 71, as shown in FIG. 6c.

Figure 6D:
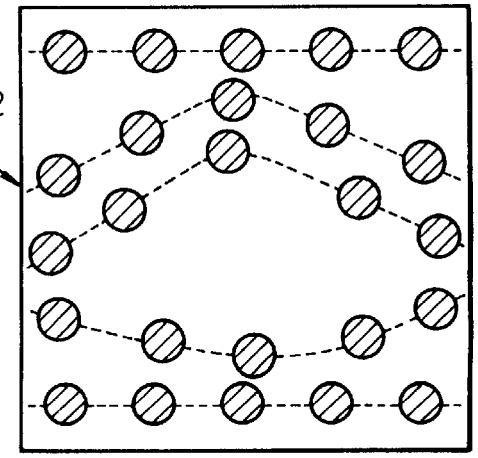

In the case where a partial unevenness or the like has developed on the surface of the wafer W as shown in FIG. 6b, on the other hand, the detection pattern on the two-dimensional light detector 62 is displaced from the normal regular pattern as shown in FIG. 6d. The measured height processing unit 63 processes the output signal of the two-dimensional light detector 62 and thereby identifies the radiation point of each light beam, thus calculating the height distribution from the amount of displacement. In this way, it is possible to determine the distance ($\Delta L$) between two points including a point where the partial unevenness has developed and a point of normal height and the difference ($\Delta H$) of height between the two points. These information ($\Delta L$, $\Delta H$) are used for determining the estimation value (K) of the partial unevenness for each wafer, as described later.

As seen from above, the apparatus according to the first embodiment can simultaneously measure the height distribution in the range on the wafer W irradiated with a plurality of light beams emitted from the light beam emitter 61. Since the height distribution in this range is measured at a time, the measurement can be completed within a short time without being affected by the degree of accuracy of stage movement. According to this embodiment, the range on the wafer W irradiated with a plurality of light beams emitted from the light beam emitter 61 is about 2 cm square. Therefore, the height change (partial unevenness) of the wafer surface within this range can be measured.

Instead of turning on the light beam sources 71 of the light beam emitter 61 at the same time, one or a plurality of light beam sources 71 can be combined for measuring the height distribution sequentially as a spot. As a result, the identification of each beam is facilitated. In addition, since the stage is not moved in the meantime, no error is caused by the movement of the stage.

In the electron beam exposure apparatus according to the first embodiment, it is determined whether the wafer is exposed based on the estimation value (K) or the wafer and the exposure apparatus are inspected in subsequent stages without exposure. This determination is conducted by a CPU (the CPU 41 shown in FIG. 1, for example) for controlling the whole exposure apparatus. In the case where it is determined that no exposure process is conducted based on the estimation value (K), on the other hand, the estimation value (K) for the particular wafer is stored in an appropriate storage medium (the storage medium 42 shown in FIG. 1, for example) together with the information on the stage position corresponding to the position on the wafer where the particular partial unevenness has occurred. The information thus stored can be utilized for inspecting the wafer or the exposure apparatus in subsequent stages.

Figure 8:
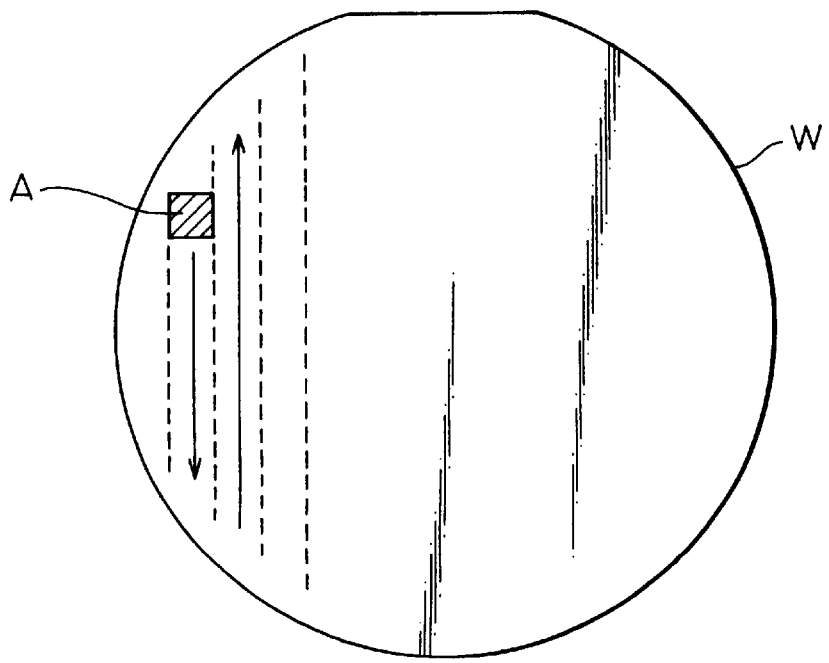
FIG. 8 is a diagram showing an example of movement of the measurement area according to the first embodiment.

As shown in FIG. 8, the range in which the height distribution can be measured by the light beam emitter 61 and the two-dimensional light detector 62 is defined as A. The height distribution within the range A is calculated by the measured height processing unit 63 at the position thereof based on the output of the two-dimensional light detector 62. After the calculation result is stored, the wafer W is moved with the stage, and the operation of measuring the height distribution in another range is repeated. In this way, the height distribution over the entire surface of the wafer W can be measured.

Figure 9:
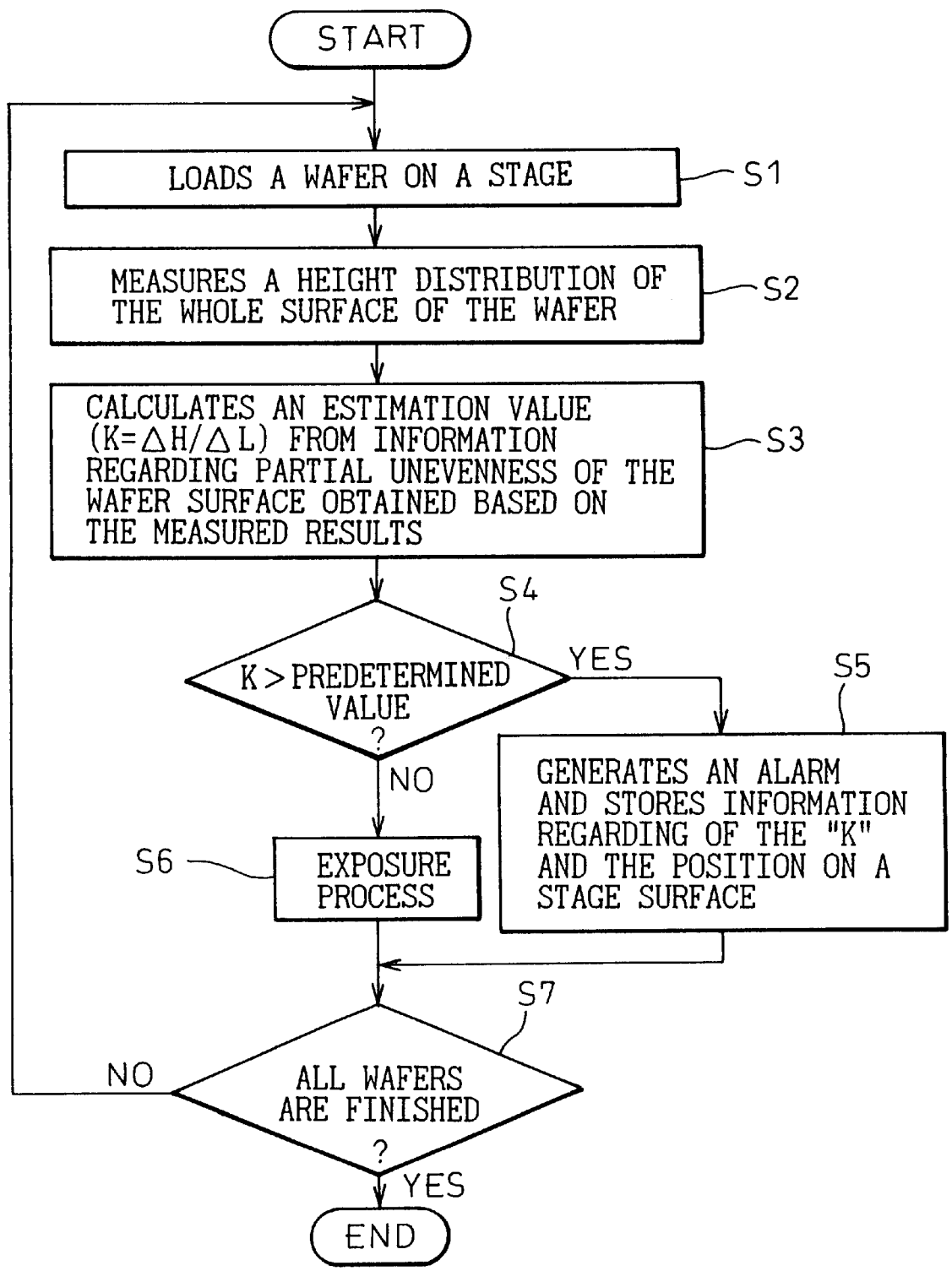
FIG. 9 is a flowchart showing the flow of the process according to the first embodiment.

Now, the processes (the height change measuring process and the exposure process) conducted by the electron beam exposure apparatus according to the first embodiment will be explained with reference to the flowchart of FIG. 9.

First, in step S1, the wafer W is loaded on the stage 33. In the next step S2, as shown in FIG. 5b, the wafer W is moved to a position under the light beam emitter 61 and the two-dimensional light detector 62, and while moving the stage 33, the measurement and storage of the height distribution in the area A shown in FIG. 8 are repeated thereby to measure the height distribution over the entire surface of the wafer W.

In the next step S3, the estimation value (K) is determined from the partial unevenness information ($\Delta L$, $\Delta H$) acquired based on the height change measurement taken over the entire exposure area of the wafer W. This is defined as K=$\Delta H/\Delta L$. In step S4, it is determined whether whether the estimation value (K) has exceeded a preset value (YES) or not (NO), i.e. whether a height change exceeding a predetermined allowance has been detected (YES) or not (NO) within a predetermined range of the exposure area of the wafer W. In the case where this determination is YES, the process proceeds to step S5, while in the case where the determination is NO, the process proceeds to step S6.

In step S6, as shown in FIG. 5a, the wafer W is exposed. This exposure process permits a highly accurate focusing of the electron beam or setting of the deflection efficiency at the time of exposure based on the height distribution measurement of the wafer surface, thus making possible a highly accurate exposure and an improved yield. After that, it is determined in step S7 whether the particular wafer is the last wafer to be processed (YES) or not (NO). In the case where the determination is YES, the flow comes to "end", while in the case where the determination is NO, the process returns to step S1 to repeat the steps mentioned above.

In the case where a height change exceeding a predetermined allowance is detected within a predetermined range of the exposure area of the wafer W, on the other hand, an alarm notifying that the wafer W is defective is generated and the particular wafer is rejected as an object of exposure in step S5. This alarm is issued by display or the like in the CPU 41. Also, the estimation value (K) on the wafer is stored in a storage medium together with the corresponding information on the stage position. In the case where the information thus stored indicates that the height change exceeding a predetermined allowance occurs at the same position on the stage, dust or the like is considered to be attached to the particular portion of the stage. In such a case, therefore, an instruction is given for cleaning the stage. The information stored in this way indicating the defective position is utilized for inspecting the apparatus and the wafer. Upon completion of step S5, the process proceeds to step S7 for repeating the steps described above.

As described above, in the electron beam exposure apparatus according to the first embodiment, the light M from the light beam emitter 61 is radiated in a predetermined small range on the wafer W loaded on the stage 33 before being exposed, and the light reflected from the particular range is detected by the two-dimensional light detector 62 for measuring the height change of the wafer surface. It is thus possible to positively detect points where the partial unevenness or the like has occurred on the wafer W which has been difficult to identify in the prior art.

According to the first embodiment, an arrangement of a plurality of beam sources 71 is used as the light beam emitter 61 for emitting a plurality of parallel light beams. Nevertheless, various other modifications are possible.

Figure 10:
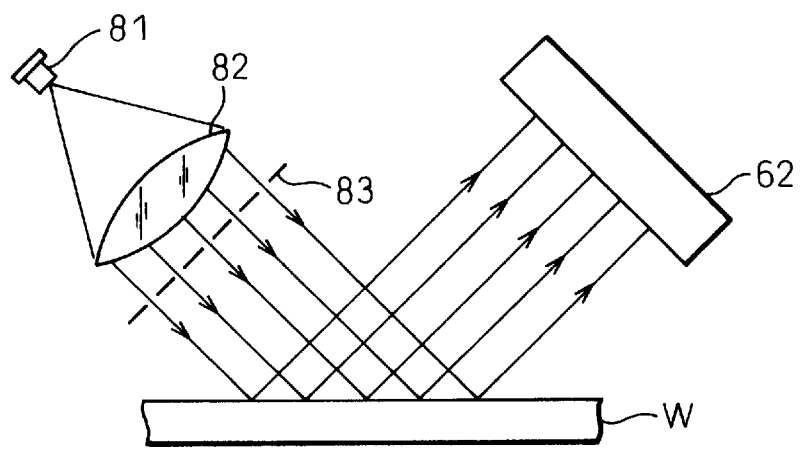
FIG. 10 is a diagram showing a configuration according to a first modification of the height measuring unit.

FIG. 10 is a diagram showing a configuration of a first modification. In this modification, the laser beam emitted from a semiconductor laser 81 is converted into a parallel beam in a collimator lens 82, and then a plurality of light beams are generated in a manner corresponding to a plurality of apertures formed in an aperture plate 83 disposed in a subsequent stage. In this case, although each light beam cannot be turned on independently, an accurate arrangement of parallel light beams can be obtained.

Also, the two-dimensional light detector 62 is arranged in such a manner that the light beams reflected from the wafer W enter it substantially at a right angle. The first embodiment, in which the two-dimensional light detector 62 is arranged parallel to the surface of the wafer W, has the advantage that in the case where the height of the wafer W changes in the same amount, the light beams reflected from the wafer W are displaced by the same amount on the two-dimensional light detector 62, thereby facilitating the calculation of the height distribution. Since the light beams enter the two-dimensional light detector 62 at a large incidence angle, however, the two-dimensional light detector 62 is required to have a large light-receiving angle, thereby posing the problem that the image pickup device that can be used is limited. With the configuration of FIG. 10, in contrast, the distance from the point where each light beam is reflected on the wafer W to the two-dimensional light detector 62 is different. Even in the case where the height change of the wafer W is the same, therefore, the displacement of each light beam on the two-dimensional light detector 62 is different, thus requiring the calculation for adjustment. Since each light beam enters the two-dimensional light detector 62 substantially at a right angle, however, a normal image pickup device can be used.

Figure 11:
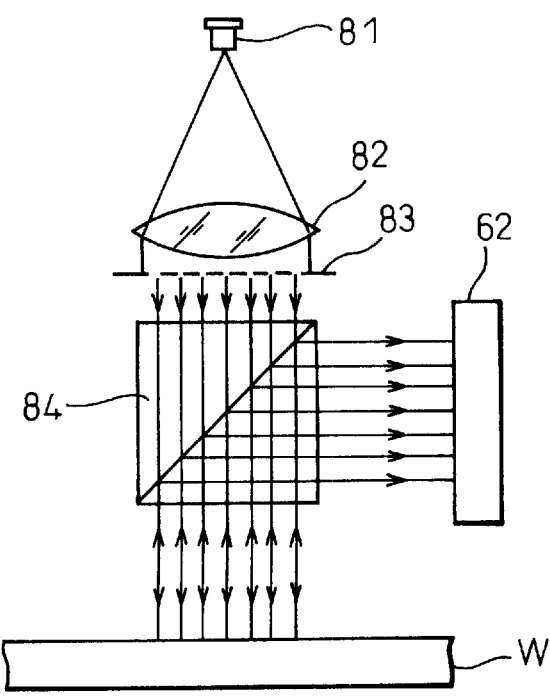
FIG. 11 is a diagram showing a configuration according to a second modification of the height measuring unit.

FIG. 11 is a diagram showing a configuration of a second modification. In this modification, like the first modification, the laser beam emitted from a semiconductor laser 81 is converted into a parallel beam in a collimator lens 82, and a plurality of light beams are generated in the manner corresponding to a plurality of apertures formed in an aperture plate 83 in a subsequent stage. The light beams enter the wafer W at right angle through a beam-splitter 84. The light beams reflected on the wafer W are reflected by the beam splitter 84 in directions 90° different and enter the two-dimensional light detector 62 substantially at right angle thereto. This configuration requires the beam splitter 84. Since the two-dimensional light detector 62 is arranged substantially parallel to the surface of the wafer W, however, each light beam reflected on the wafer W is displaced to the same degree on the two-dimensional light detector 62 as far as the height change of the wafer W is the same. In addition, each light beam enters the two-dimensional light detector 62 substantially at right angle thereto.

The first embodiment uses a height measuring unit for detecting the direction change of a plurality of parallel light beams. However, any apparatus can be used which can measure the height distribution in a given range at the same time. The second embodiment uses an interferometer as a height measuring unit.

Figure 12A:
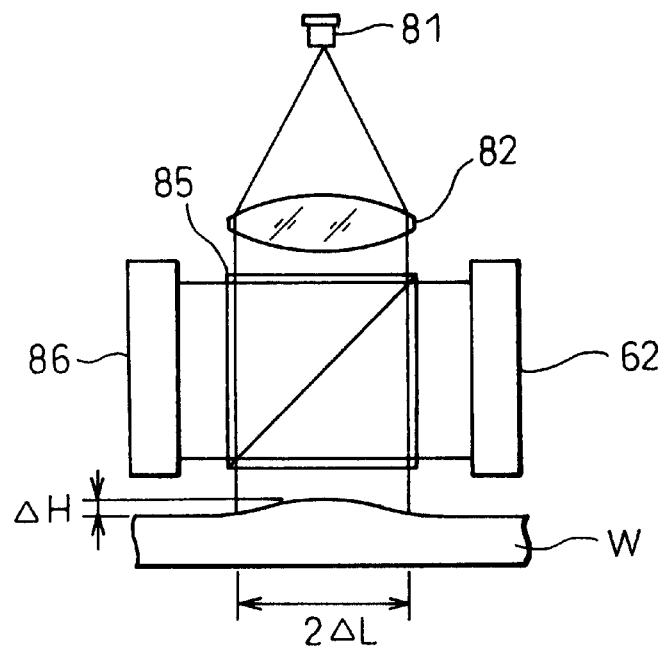
FIGS. 12a and 12b are diagrams schematically showing the configuration of the height measuring unit and the interference pattern obtained in an electron beam exposure apparatus according to a second embodiment of the invention.
Figure 12B:
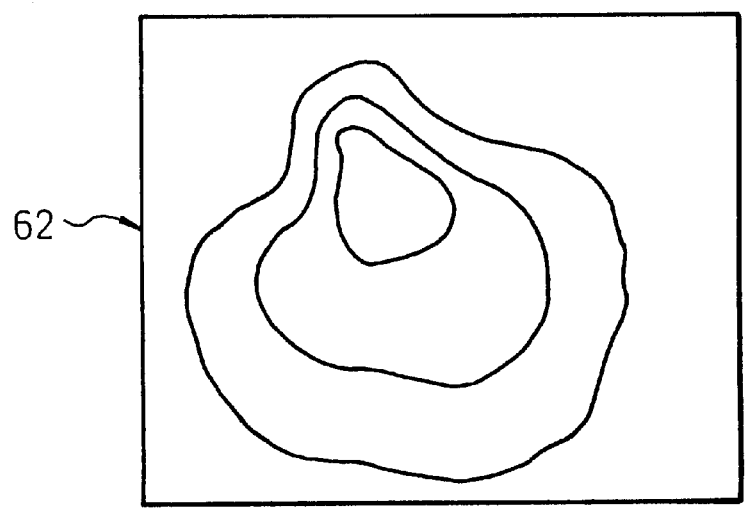

FIG. 12 is a diagram showing a configuration of a height measuring unit for an electron beam exposure apparatus according to the second embodiment. The parts other than the height measuring unit are identical to the corresponding parts of the first embodiment.

As shown in FIG. 12, the laser beam emitted from the semiconductor laser 81 is converted into a parallel beam in the collimator lens 82, and split into two beams in the beam splitter 85. One of the beams enters the wafer W at right angle, and the other beam enters at right angle to a reference mirror 86 having an optically flat reflection surface. The beam reflected on the wafer W and the beam reflected on the reference mirror 86 enter the beam splitter 85 again, and after being combined and interfered with each other, enter the two-dimensional light detector 62. Thus, by detecting and analyzing the interference fringe corresponding to the height distribution of the wafer W, the two-dimensional light detector 62 can measure the height distribution of the wafer W. The resulting measurement is used to determine the estimation value (K) of the partial unevenness of the wafer.

In the foregoing embodiments, the block exposure method was taken as an example. However, the present invention, as obvious from the subject matter thereof, is of course applicable to any type of exposure method such as the variable rectangle exposure method or the blanking aperture array (BAA) exposure method with equal effect.

Also, in spite of the foregoing description that the electron beam is used as a charged particle beam, it will be obvious that the present invention is not limited to the electron beam, but an ion beam can also be used with equal effect.

It will thus be understood from the foregoing description that in a charged particle beam exposure apparatus and an exposure method according to this invention, a partial unevenness or the like occurred in the surface of a specimen to be exposed can be positively detected. Therefore, the height measurement of the specimen surface and the height adjustment based on the height measurement can be effected with high accuracy. This greatly contributes to a highly accurate exposure and an improved yield.

What is claimed is:

1. A charged particle beam exposure apparatus comprising:

a charged particle beam source for generating a charged particle beam;

a shaper for shaping said charged particle beam;

a deflector for changing the position where said charged particle beam is radiated on a specimen to be exposed;

a projector for projecting said charged particle beam on said specimen;

a control unit for controlling said deflector and said projector at the time of exposure;

means for plotting a pattern on said specimen by the charged particle beam projected and deflected appropriately;

a stage for moving said specimen within said apparatus; and a height measuring unit for measuring the height distribution in a predetermined range of said specimen with at least a predetermined density while said specimen is loaded in said apparatus;

a detected height processing unit for changing the point of measurement of said specimen by said height measuring unit by moving said specimen with said stage, combining the measurements at respective points and measuring the height distribution over the entire surface of said specimen to said exposure; and an alarm generator for issuing an alarm indicating the detection of a height change, if any, exceeding a predetermined allowance by said height measuring unit within a predetermined range of the exposure area on said specimen to be exposed.

2. A charged particle beam exposure apparatus according to claim 1, further comprising a storage unit for storing the information on the position of said stage corresponding to the position on said specimen where said height change has occurred.

3. A charged particle beam exposure apparatus according to claim 2, further comprising a determination unit for determining whether the height change exceeding said predetermined allowance is caused by the individual specimen or by said stage, from the information on said stage position where said alarm is generated for a plurality of said specimens.

4. A charged particle beam exposure apparatus according to claim 1, further comprising an alarm generator for issuing an alarm indicating the detection of a height change, if any, exceeding a predetermined allowance by said height measuring unit within a predetermined range of the exposure area on said specimen to be exposed; and a storage unit for storing the information on the position of said stage corresponding to the position on said specimen where said height change has occurred.

5. A charged particle beam exposure apparatus according to claim 4, further comprising a determination unit for determining whether the height change exceeding said predetermined allowance is caused by the individual specimen or by said stage, from the information on said stage position where said alarm is generated for a plurality of said specimens.

6. A charged particle beam exposure apparatus according to claim 1, wherein said height measuring unit includes a light beam emitter for emitting a plurality of parallel light beams in a two-dimensional array and a two-dimensional light detector for detecting a plurality of said light beams reflected on the surface of said specimen to be exposed.

7. A charged particle beam exposure apparatus according to claim 6, wherein said light beam emitter includes a plurality of light beam sources in a two-dimensional array.

8. A charged particle beam exposure apparatus according to claim 6, wherein said light beam emitter includes a laser light source, a lens for converting the laser beam emitted from said laser light source into a parallel beam, and an aperture plate having a plurality of apertures in a two-dimensional array for splitting said parallel beam into a plurality of beams corresponding to said apertures.

9. A charged particle beam exposure apparatus according to claim 1, wherein said height measuring unit is an interference unit for measuring the height distribution from the interference fringe generated by the interference between the light beam reflected on a reference plane and the light beam reflected on the surface of said specimen to be exposed.

10. A charged particle beam exposure apparatus according to claim 9, wherein said interference unit includes a laser light source, a lens for converting the laser beam emitted from said laser light source into a parallel beam, a reference reflection surface, a beam splitter for splitting said parallel beam into a beam incident to the surface of said specimen and a beam incident to the surface of said reference surface and combining the beam reflected on the surface of said specimen with the beam reflected on the surface of said reference surface, and a two-dimensional light detector for detecting the interference pattern obtained by the combined light beam.

11. A charged particle beam exposure apparatus according to claim 1, wherein said control unit adjusts at least one of the deflection amount of said deflector and the focal point of said projector in accordance with the height distribution measurement.

12. A charged particle beam exposure method for plotting a pattern on a specimen to be exposed, by a charged particle beam converged and deflected appropriately on said specimen, comprising the steps of, before plotting a pattern by said charged particle beam:

loading said specimen on a stage of the exposure apparatus;

measuring the height distribution within a predetermined range of said specimen with at least a predetermined density;

changing the measuring point of said specimen by moving said specimen with said stage, combining the measurements at the respective points and thus calculating the height distribution over the entire surface of said specimen;

determining based on said measurement whether a partial height change of the surface of said specimen is allowable or not; and exposing said specimen in the case where said partial height change of the surface of said specimen is allowable.

13. A charged particle beam exposure method according to claim 12, wherein said determination as to the allowability of the partial height change of the surface of said specimen is effected by determining whether the estimation value K defined as $K=\Delta H/\Delta L$ has exceeded a predetermined value, where $\Delta L$ is the distance between two points in the exposure area on said specimen and $\Delta H$ is the difference of height between said two points.

14. A charged particle beam exposure method according to claim 13, wherein, in the case where said determination as to the allowability is negative, an alarm is issued indicating that said specimen has a defect, the exposure process for said specimen is held, and the estimation value K for said specimen is stored in a storage medium together with the information on the stage position corresponding to the position on said specimen where the height change has occurred.

* * * * *